(12) United States Patent
Cheng et al.

(10) Patent No.: US 8,541,315 B2
(45) Date of Patent: Sep. 24, 2013

(54) HIGH THROUGHPUT EPITAXIAL LIFT OFF FOR FLEXIBLE ELECTRONICS

(75) Inventors: Cheng-Wei Cheng, White Plains, NY (US); Kuen-Ting Shiu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 127 days.

(21) Appl. No.: 13/236,119

(22) Filed: Sep. 19, 2011

(65) Prior Publication Data

US 2013/0071999 A1    Mar. 21, 2013

(51) Int. Cl.
  *H01L 21/302* (2006.01)
(52) U.S. Cl.
  USPC .......................................... 438/745
(58) Field of Classification Search
  USPC .................................. 438/478, 745
  See application file for complete search history.

(56) References Cited

U.S. PATENT DOCUMENTS

| | | | |
|---|---|---|---|
| 5,541,438 A | 7/1996 | Martin et al. | |
| 5,677,785 A | 10/1997 | Koo et al. | |
| 7,226,509 B2 | 6/2007 | Faure | |
| 2002/0168834 A1 | 11/2002 | Chen et al. | |
| 2007/0172975 A1 | 7/2007 | Tomomatsu et al. | |
| 2009/0044860 A1 | 2/2009 | Pan et al. | |
| 2010/0237499 A1 | 9/2010 | Kim | |
| 2011/0186910 A1* | 8/2011 | Forrest et al. | 257/190 |

OTHER PUBLICATIONS

International Search Report and Written Opinion dated Nov. 26, 2012 received in a corresponding foreign application.

* cited by examiner

*Primary Examiner* — Bradley K Smith
(74) *Attorney, Agent, or Firm* — Scully, Scott, Murphy & Presser, P.C.; Louis J. Percello, Esq.

(57) ABSTRACT

A method of removing a semiconductor device layer from an underlying base substrate is provided in which a sacrificial phosphide-containing layer is formed between a semiconductor device layer and a base substrate. In some embodiments, a semiconductor buffer layer can be formed on an upper surface of the base substrate prior to forming the sacrificial phosphide-buffer layer. The resultant structure is then etched utilizing a non-HF etchant to release the semiconductor device layer from the base semiconductor substrate. After releasing the semiconductor device layer from the base substrate, the base substrate can be re-used.

24 Claims, 4 Drawing Sheets

HIGH THROUGHPUT EPITAXIAL LIFT OFF FOR FLEXIBLE ELECTRONICS

BACKGROUND

The present disclosure relates to semiconductor device manufacturing, and more particularly to a method of removing a semiconductor device layer from an underlying base substrate.

Devices that can be produced in thin-film form have three clear advantages over their bulk counterparts. First, by virtue of less material used, thin-film devices ameliorate the materials cost associated with device production. Second, low device weight is a definite advantage that motivates industrial-level effort for a wide range of thin-film applications. Third, if dimensions are small enough, devices can exhibit mechanical flexibility in their thin-film form. Furthermore, if a device layer is removed from a substrate that can be re-used, additional fabrication cost reduction can be achieved.

Efforts to (i) create thin-film substrates from bulk materials (i.e., semiconductors) and (ii) form thin-film device layers by removing device layers from an the underlying bulk substrates on which they were formed are ongoing.

SUMMARY

A method of removing a semiconductor device layer from an underlying base substrate is provided in which a sacrificial phosphide-containing layer is formed between a semiconductor device layer and a base substrate. In some embodiments, a semiconductor buffer layer can be formed on an upper surface of the base substrate prior to forming the sacrificial phosphide-containing layer. The resultant structure is then etched utilizing a non-HF etchant to release the semiconductor device layer from the base substrate. After releasing the semiconductor device layer from the base substrate, the base substrate can be re-used.

The ELO process of the present disclosure has a lower cost associated therewith. Moreover, and as mentioned above, the base substrate can be re-used after performing the ELO process of the present disclosure.

In one embodiment, the method of the present disclosure includes forming a sacrificial phosphide-containing layer on an upper surface of a base substrate. Next, a semiconductor device layer is formed on an upper surface of the sacrificial phosphide-containing layer. The sacrificial phosphide-containing layer is then removed from between the semiconductor device layer and the base substrate by etching with a non-HF containing etchant.

In another embodiment, the method of the present disclosure includes forming a semiconductor buffer layer on an upper surface of a base substrate. A sacrificial phosphide-containing layer is then formed on an upper surface of the semiconductor buffer layer. Next, a semiconductor device layer is formed on an upper surface of the sacrificial phosphide-containing layer. The sacrificial phosphide-containing layer located between the semiconductor device layer and the base substrate is then removed by etching with a non-HF containing etchant. Next, the semiconductor buffer layer can be removed from atop the base substrate.

DETAILED DESCRIPTION

The present disclosure, which provides a method of removing a semiconductor device layer from an underlying base substrate, will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present disclosure. However, it will be appreciated by one of ordinary skill in the art that the various embodiments of the disclosure may be practiced without these specific details. In other instances, well-known structures or processing steps have not been described in detail in order to avoid obscuring the various embodiments of the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

One way to form a thin film device is to release a semiconductor device layer from a base substrate utilizing an epitaxial lift off (ELO) process. In a conventional ELO process for III-V compound semiconductor materials, an AlAs layer is inserted between the III-V compound semiconductor material and an overlying semiconductor device layer. The resultant structure is then subjected to etching in HF. After the etch, the semiconductor device layer is released from the III-V compound semiconductor material.

The conventional ELO process mentioned above requires that an adhesive tape and a metal foil be formed on an exposed surface of the semiconductor device layer prior to the HF etch. This structure is then flipped up-side down and a weight is applied to an outer edge portion of the metal foil. During HF etching, this special set-up helps to accelerate the etching rate, and prevent the etch from stopping.

The conventional ELO process mentioned above is used for only one III-V compound semiconductor material at a time and attention is needed during the etch. As such, the yield using the conventional ELO process is low. In addition to the above drawbacks with the conventional ELO process, the conventional ELO process uses HF as the etchant which is a hazardous chemical that needs special containers for the disposable thereof. Further, the III-V compound semiconductor material that is recovered after the conventional ELO process is shiny and rough (having a RMS surface roughness from 2 nm to 4 nm) due to the remaining $AlF_3$ complex compounds on the surface and the attack of the etchant, HF, to the GaAs surface. Chemical mechanical polishing and further treatments are typically needed to smooth the surface of the III-V compound semiconductor that is recovered from the conventional ELO process. As such, the original III-V compound semiconductor material that was used in the conventional ELO process is not re-useable, if no further treatments are employed.

The present disclosure provides a method of removing a semiconductor device layer from an underlying base substrate (i.e., III-V compound semiconductor or Ge-containing semiconductor) in which a sacrificial phosphide-containing layer is formed between the semiconductor device layer and the base substrate. In some embodiments, particularly in which a Ge-containing semiconductor base substrate is employed, a semiconductor buffer layer can be formed on an upper surface of the base substrate prior to forming the sacrificial phosphide-containing layer. The resultant structure is then etched utilizing a non-HF etchant to release the semiconductor device layer from the base semiconductor substrate. After releasing the semiconductor device layer from the base substrate, the base substrate can be re-used.

The method of the present disclosure provides high yield and high throughput as well as the ability to re-use the base substrate after the semiconductor device layer has been removed there from. Also, no special set-up is typically required.

These and other advantages of the method of the present disclosure are illustrated in Table 1. Specifically, Table 1 provides a comparison of a conventional ELO (AlAs layer and HF etch) and the ELO process of the present disclosure (sacrificial phosphide-containing layer and non-HF etch).

TABLE 1

| | Conventional ELO | ELO Process of the Present Disclosure |
|---|---|---|
| Etchant | HF(hazardous) | Non-HF |
| Special Setup | Required | Typically Not Required |
| Attention Needed | Yes | No |
| Yield | Moderate | High (approximately 100%) |
| Throughput | One sample for each set up | Non-limiting |
| Substrate Re-use | No (rough surface 2 to 4 nm after etch) | Yes (smooth surface 0.1 to 0.5 nm or within ±0.5 nm of initial RMS roughness) |
| Cost | High | Low |

Figure 1:
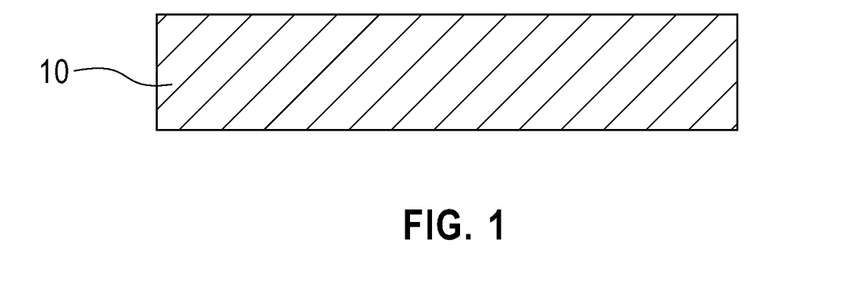
FIG. 1 is a pictorial representation (through a cross sectional view) depicting an initial structure including a base substrate that can be employed in accordance with one embodiment of the present disclosure.

Reference is now made to FIG. 1 which illustrates a base substrate 10 that can be employed in the method of the present disclosure. In one embodiment of the present disclosure, the base substrate 10 that can be employed comprises an III-V compound semiconductor material. The term "III-V compound semiconductor" as used throughout the present disclosure denotes a semiconductor compound that is composed of at least one element from Group III of the Periodic Table of Elements and at least one element from Group V of the Periodic Table of Elements. The III-V compound semiconductor material that can be employed as base substrate 10 may comprise a binary, i.e., two element, III-V compound semiconductor, a ternary, i.e., three element, III-V compound semiconductor or a quaternary, i.e., four element, III-V compound semiconductor. III-V compound semiconductor materials containing greater than 4 elements can also be used as base substrate 10.

Examples of III-V compound semiconductor materials that can be employed as base substrate 10 include, but are not limited to, GaAs, InP, AlAs, GaSb, GaN, InGaAs, InGaN, InGaP, AlInGaP, and AlInGaSb. In some embodiments, the base substrate 10 is composed of a III-V compound semiconductor that does not include P therein. In one embodiment of the present disclosure, the base substrate 10 is comprised of GaAs.

In another embodiment, the base substrate 10 is comprised of a Ge-containing semiconductor material. The term "Ge-containing semiconductor material" is used throughout the present disclosure to denote a semiconductor that includes Ge. The Ge-containing material may comprise pure Ge or Ge that is alloyed with another semiconductor material, such as, for example, Si. Thus, the Ge-containing semiconductor that can be employed in the present disclosure typically includes Ge in a content ranging from 1 atomic % Ge up to, and including 100 atomic % Ge. In another embodiment, the Ge-containing material that can be used as base substrate 10 is a SiGe alloy comprising from 1 atomic % Ge to 99 atomic % Ge.

The initial thickness of the base substrate 10 can vary depending on the size of the wafer employed. In one embodiment and for a 2 inch wafer, the base substrate 10 typically has an initial thickness from 200 μm to 800 μm, with an initial thickness from 300 μm to 400 μm being more typical for a 2 inch wafer. The term "initial thickness" when used in conjunction with the base substrate 10 denotes the thickness of the base substrate 10 prior to subjecting the base substrate 10 to the etching process described herein below.

The base substrate 10 that is employed in the present disclosure typically has an initial RMS surface roughness from 0.1 nm to 1 nm, within an initial RMS surface roughness from 0.2 nm to 0.5 nm being more typical. The initial RMS surface roughness is a measurement of the texture of the base substrate 10 prior to etching.

Figure 2:
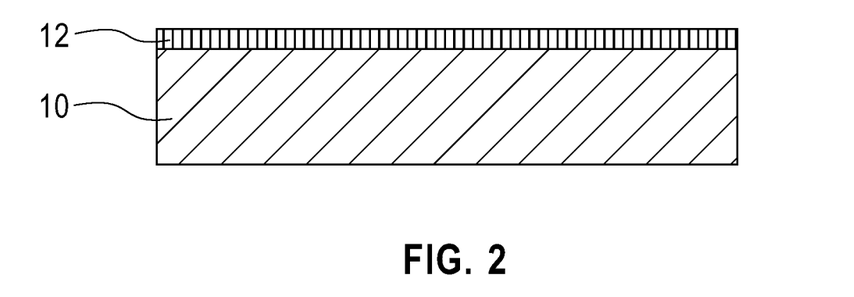
FIG. 2 is a pictorial representation (through a cross sectional view) depicting the structure of FIG. 1 after forming an optional semiconductor buffer layer on an upper surface of the base substrate.

Referring now to FIG. 2, there is illustrated the structure of FIG. 1 after forming an optional semiconductor buffer layer 12 on an upper surface of the base substrate 10. As mentioned, the semiconductor buffer layer 12 is optional. As such, and in some embodiments, the optional semiconductor buffer layer 12 can be omitted. In other embodiments, the optional semiconductor buffer layer 12 is employed. For example, and in one embodiment of the present disclosure, the optional semiconductor buffer layer 12 that can be employed is formed atop a Ge-containing semiconductor material.

The optional semiconductor buffer layer 12 that can be employed includes a semiconductor material that differs in terms of its composition from the underlying base substrate 10. Although the optional semiconductor buffer layer 12 is composed of a different semiconductor material than the underlying base substrate 10, the optional semiconductor buffer layer 12 can have the same or different lattice constant as the underlying base substrate 10. The term "buffer" when used in conjunction with the term "optional semiconductor buffer layer 12" denotes an intermediate layer that is located between the base substrate 10 and the semiconductor device layer 16 (to be subsequently formed).

The optional semiconductor buffer layer 12 may comprise a semiconductor material including, but not limited to, Si, Ge, SiGe, SiGeC, SiC, Ge alloys, GaSb, GaP, GaAs, InAs, InP, and all other III-V or II-VI compound semiconductors. In one embodiment in which a Ge-containing material is employed as the base substrate 10, the optional semiconductor buffer layer 12 can be composed of a III-V compound semiconductor, such as, for example, GaAs or InGaAs. In some embodiments, the optional semiconductor buffer layer 12 is composed of an III-V compound semiconductor that does not include P therein.

In one embodiment, the semiconductor material that can be employed as the optional semiconductor buffer layer 12 can be single crystalline. In another embodiment, the semiconductor material that can be employed as the optional semiconductor buffer layer 12 can be polycrystalline. In yet another embodiment of the present disclosure, the semiconductor material that can be employed as the optional semiconductor buffer layer 12 can be amorphous. Typically, the semiconductor material that can be employed as the optional semiconductor buffer layer 12 is a single crystalline material.

The optional semiconductor buffer layer 12 can be formed on an upper surface of the base substrate 10 utilizing techniques that are well known to those skilled in the art. In one embodiment, the optional semiconductor buffer layer 12 can be formed atop the base substrate 10 by a physical or growth deposition process in which a semiconductor precursor is employed. In another embodiment, the optional semiconductor buffer layer 12 can be formed by an epitaxial growth process. When an epitaxial growth process is employed, the optional semiconductor buffer layer 12 is epitaxially aligned with the underlying surface of the base substrate 10. In yet another embodiment, the optional semiconductor buffer layer 12 can formed atop the base substrate 10 utilizing a layer transfer process.

The thickness of the optional semiconductor buffer layer 12 that is employed in the present disclosure can vary depending on the technique that was used in forming the same. In one embodiment, the optional semiconductor buffer layer 12 has a thickness from 1 nm to 100 nm. In another embodiment, the optional semiconductor buffer layer 12 has a thickness from 1 nm to 2000 nm. Other thicknesses that are above and/or below the aforementioned ranges can also be used for the optional semiconductor buffer layer 12.

Figure 3A:
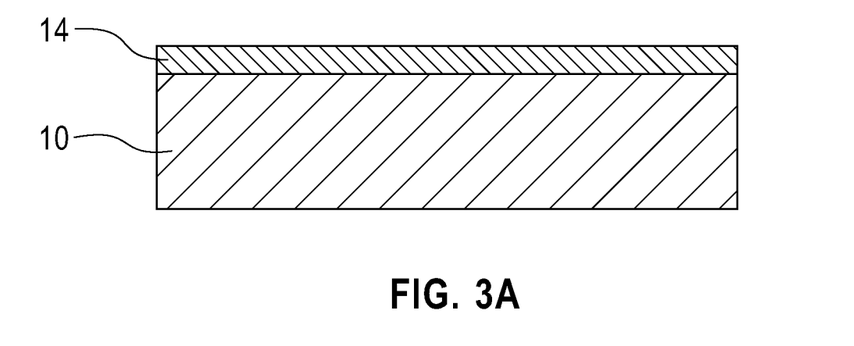
FIGS. 3A and 3B are pictorial representations (through cross sectional views) depicting the structures of FIG. 1 and FIG. 2, respectively, after forming a sacrificial phosphide-containing layer thereon.
Figure 3B:
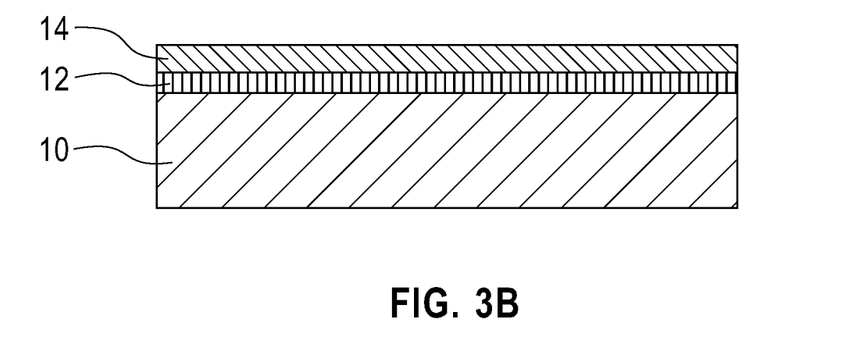

Referring to FIGS. 3A and 3B, there are illustrated the structures of FIG. 1 and FIG. 2, respectively, after forming a sacrificial phosphide-containing layer 14 thereon. In the embodiment illustrated in FIG. 3A, the sacrificial phosphide-containing layer 14 is formed directly on an upper surface of the base substrate 10. In the embodiment illustrated in FIG. 3B, the sacrificial phosphide-containing layer 14 is formed directly on an upper surface of the optional semiconductor buffer layer 12.

The term "sacrificial phosphide-containing layer" is used throughout the present disclosure to denote a compound of phosphorus with a less electronegative element or elements. In some embodiments, the sacrificial phosphide-containing layer 14 is a different semiconductor material than the base substrate 10, the optional semiconductor buffer layer 12 and the semiconductor device layer 16 (to be subsequently formed). In such an embodiment, the sacrificial phosphide-containing layer 14 has a higher content of phosphorus therein as compared with the base substrate 10, optional semiconductor buffer layer 12, and semiconductor device layer 16 (to be subsequently formed). In this embodiment, the sacrificial phosphide-containing layer 14 has a higher etch rate in non-HF containing etchants as compared to base substrate 10, optional semiconductor buffer layer 12 and the semiconductor device layer 16 (to be subsequently formed).

In some embodiments, the sacrificial phosphide-containing layer 14 can be a same semiconductor material as at least one of the base substrate 10, the optional semiconductor buffer layer 12 and the semiconductor device layer 16 (to be subsequently formed). For example, the semiconductor device layer 16 may also include a phosphide-containing material and thus it has the same etching rate as that of the sacrificial phosphide-containing layer 14. In such an embodiment, a first protection layer is formed by conventional methods including thermal growth or deposition between the sacrificial phosphide-containing layer 14 and the semiconductor device layer 16 to prevent the semiconductor device layer 16 from being etched by the non-HF etchant. The first protection layer can be GaAs or other non-phosphide-containing materials which are not etched by the non-HF etchant. Also, a second protection layer is formed atop exposed surfaces (top and sidewalls) of the semiconductor device layer 16 to prevent the semiconductor device layer 16 from being etched by the non-HF etchant. The second protection layer could be $SiO_2$, $Si_3N_4$ or other materials which are not etched by the non-HF etchant. This embodiment will be described in greater detail herein below.

With respect to the sacrificial phosphide-containing layer 14 and in one embodiment, the element or elements having less electronegative than phosphorus include an element from Group III and/or Group V of the Periodic Table of Elements. Illustrative materials that can be used as the sacrificial phosphide-containing layer 14 include, but are not limited to, InAlP, InGaP, InAsP, GaAsP, InGaAlP, InGaAsP, GaP, InP and phosphide-containing alloys.

In one embodiment, the sacrificial phosphide-containing layer 14 can be single crystalline. In another embodiment, the sacrificial phosphide-containing layer 14 can be polycrystalline. In yet another embodiment of the present disclosure, the sacrificial phosphide-containing layer 14 can be amorphous. Typically, the sacrificial phosphide-containing layer 14 is a single crystalline material.

The sacrificial phosphide-containing layer 14 can be formed utilizing techniques that are well known to those skilled in the art. In one embodiment, the sacrificial phosphide-containing layer 14 can be formed atop the base substrate 10 or atop the optional semiconductor buffer layer 12 by a physical or growth deposition process in which a semiconductor precursor is employed. In another embodiment, the sacrificial phosphide-containing layer 14 can be formed by an epitaxial growth process. When an epitaxial growth process is employed, the sacrificial phosphide-containing layer 14 is epitaxially aligned with the underlying surface of the base substrate 10 or the underlying surface of the optional semiconductor buffer layer 12. In yet another embodiment, the sacrificial phosphide-containing layer 14 can formed atop the base substrate 10 or optional semiconductor buffer layer 12 utilizing a layer transfer process.

The thickness of the sacrificial phosphide-containing layer 14 that is employed in the present disclosure may vary depending on the technique that was used in forming the same. In one embodiment, the sacrificial phosphide-containing layer 14 has a thickness from 1 nm to 1000 nm. In another embodiment, the sacrificial phosphide-containing layer 14 has a thickness from 10 nm to 100 nm. Other thicknesses that are above and/or below the aforementioned ranges can also be used for the sacrificial phosphide-containing layer 14.

Figure 4A:
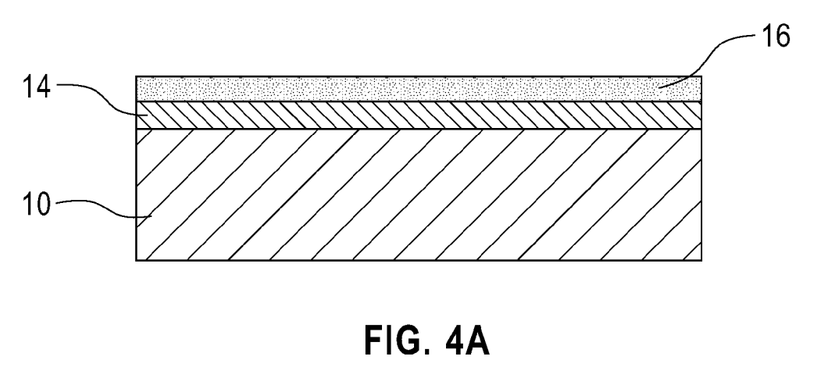
FIGS. 4A and 4B are pictorial representations (through cross sectional views) depicting the structures of FIGS. 3A and 3B, respectively, after forming a semiconductor device layer thereon.
Figure 4B:
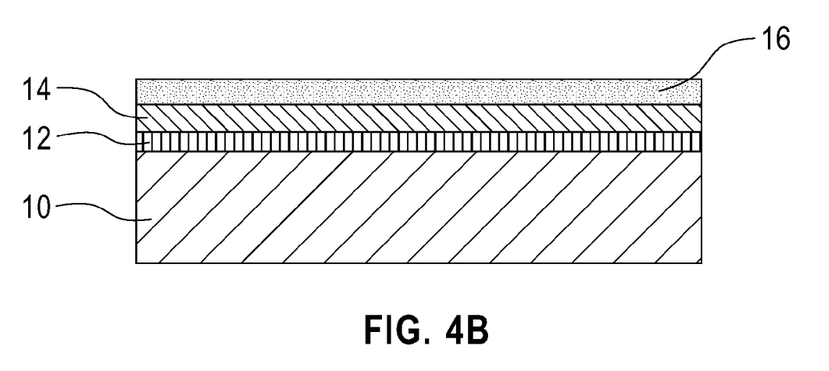

Referring now to FIGS. 4A and 4B, there are illustrated the structures of FIGS. 3A and 3B, respectively, after forming a semiconductor device layer 16 thereon. In one embodiment and as previously stated, the semiconductor device layer 16 employed comprises a semiconductor material that has a lower etchant rate in a non-HF containing etchant as compared to that of the underlying sacrificial phosphide-containing layer 14. In other embodiments, and as previously stated, the semiconductor device layer 16 may employ a phosphide-containing material that may have the same etching rate as that of sacrificial phosphide-containing layer 14. In this embodiment and as mentioned above, the extra protection layers will be needed to protect the semiconductor device layer 16 from being etched.

Examples of semiconductor materials that can be employed as the semiconductor device layer 16 include, but are not limited to, Si, Ge, SiGe, SiGeC, SiC, Ge alloys, GaSb, GaP, GaAs, InAs, InP, and all other III-V or II-VI compound semiconductors. In some embodiments, the semiconductor device layer 16 is composed of a III-V compound semiconductor that does not include P therein.

In some embodiments, the semiconductor device layer 16 is a bulk semiconductor material. In other embodiments, the semiconductor device layer 16 may comprise a layered semiconductor material such as, for example, a semiconductor-on-insulator or a semiconductor on a polymeric substrate. Illustrated examples of semiconductor-on-insulator substrates that can be employed as semiconductor device layer 16 include silicon-on-insulators and silicon-germanium-on-insulators.

In some embodiments, the semiconductor device layer 16 comprises a same semiconductor material as that of the base substrate 10. In another embodiment, the semiconductor device layer 16 and the base substrate 10 comprise different semiconductor materials. The semiconductor material of the semiconductor device layer 16 can be doped, undoped or contain doped regions and undoped regions.

In one embodiment, the semiconductor material that can be employed as the semiconductor device layer 16 can be single crystalline. In another embodiment, the semiconductor material that can be employed as the semiconductor device layer 16 can be polycrystalline. In yet another embodiment of the present disclosure, the semiconductor material that can be employed as the semiconductor device layer 16 can be amorphous. Typically, the semiconductor material that can be employed as the semiconductor device layer 16 is a single crystalline material.

The semiconductor device layer 16 can be formed on an upper surface of the sacrificial phosphide-containing layer 14 utilizing techniques that are well known to those skilled in the art. In one embodiment, the semiconductor device layer 16 can be formed atop the sacrificial phosphide-containing layer 14 by a physical or growth deposition process in which a semiconductor precursor is employed. In another embodiment, the semiconductor device layer 16 can be formed by an epitaxial growth process. When an epitaxial growth process is employed, the semiconductor device layer 16 is epitaxially aligned with the underlying surface of the sacrificial phosphide-containing layer 14. In yet another embodiment, the semiconductor device layer 16 can formed atop the sacrificial phosphide-containing layer 14 utilizing a layer transfer process.

The semiconductor device layer 16 can be processed to include at least one semiconductor device including, but not limited to, a transistor, a capacitor, a diode, a BiCMOS, a resistor, a component of photovoltaic cell, a component of a solar cell, etc. In one embodiment, the at least one semiconductor device can be formed on the semiconductor device layer 16 after formation of the semiconductor device layer 16 onto the sacrificial phosphide-containing layer 14. In another embodiment, the at least one semiconductor device can be formed prior to forming the semiconductor device layer 16 on the sacrificial phosphide-containing layer 14.

The thickness of the semiconductor device layer 16 that is employed in the present disclosure can vary depending on the type of device that is to be presented thereon. In one embodiment, the semiconductor device layer 16 has a thickness from 3 nm to 1000 nm. In another embodiment, the semiconductor device layer 16 has a thickness from 5 nm to 100 nm. Other thicknesses that are above and/or below the aforementioned ranges can also be used for the semiconductor device layer 16.

Figure 5A:
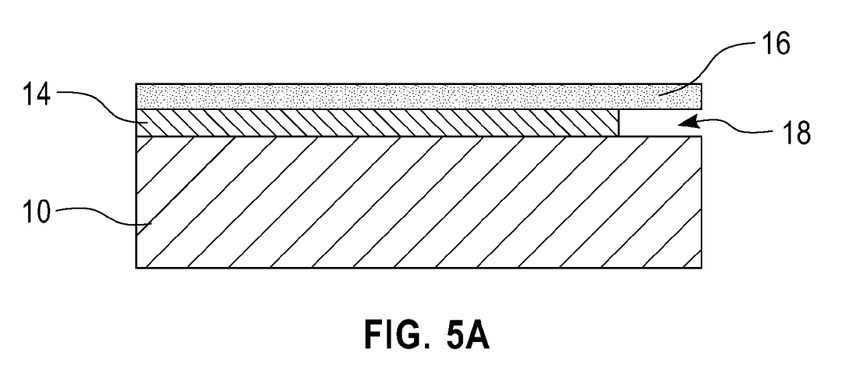
FIGS. 5A and 5B are pictorial representations (through cross sectional views) depicting the structures of FIGS. 4A and 4B, respectively, during an initial stage of an etching process in accordance with the present disclosure.
Figure 5B:
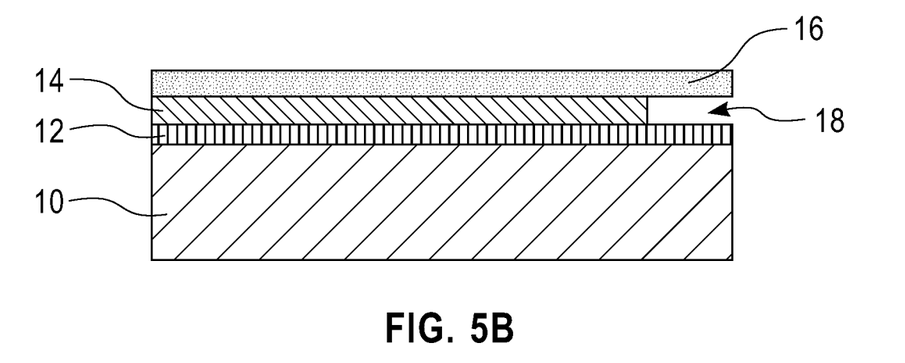
Figure 6A:
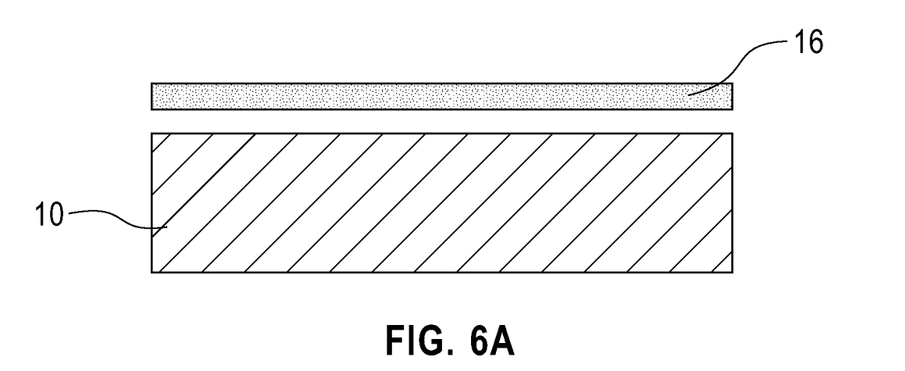
FIGS. 6A and 6B are pictorial representations (through cross sectional views) depicting the structures of FIGS. 5A and 5B, respectively, after performing the etching process in accordance with the present disclosure.
Figure 6B:
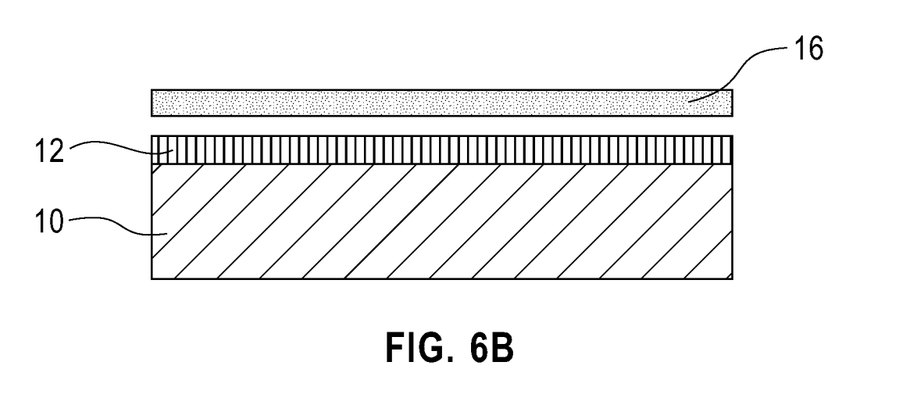

Referring now to FIGS. 5A and 5B, there are illustrated the structures of FIGS. 4A and 4B, respectively, during an initial stage of an etching process in which a non-HF-containing etchant is employed. In these drawings, reference numeral 18 denotes a gap that is formed within at least one edge of the sacrificial phosphide-containing layer 14 that is exposed to the non-HF-containing etchant. FIGS. 6A and 6B illustrate the structures of FIGS. 5A and 5B, respectively, after performing the etching process in accordance with the present disclosure.

As mentioned above, the etching that is illustrated in FIGS. 5A, 5B, 6A and 6B is performed utilizing a non-HF etchant. Specifically, the etch that is employed in the present disclosure includes any non-HF etchant that selectively etches the sacrificial phosphide-containing layer 14 relative to the other semiconductor layers (i.e., layers 10, 12, 16) and optional protection layers that are present in the structures. In some embodiments and as previously mentioned, the sacrificial phosphide-containing layer 14 has a higher etch rate in the non-HF etchant as compared to the base substrate 10, the optional semiconductor buffer layer 12 and the semiconductor device layer 16. In other embodiments and as also previously mentioned, the etching rate of sacrificial phosphide-containing layer 14 may be the same as that of semiconductor device layer 16 and the extra protection layers are needed to be applied during the etch.

In addition, the etch that is employed in the present disclosure includes any non-HF etchant that is capable of dissolving the etched reaction product such that no etched reaction product forms on the surface of the base substrate 10 during the etch. Stated in other terms, the non-HF etchant employed in the present disclosure reacts with the sacrificial phosphide-containing layer 14 and forms "highly" soluble reaction products which do not stay on the base substrate 10. For example, and in the present disclosure, an InAlP sacrificial phosphide-containing layer reacts with HCl to form $InCl_3$, $AlCl_3$, and $PH_3$, as reaction products. $PH_3$ is a gaseous product and it can diffuse from the reaction front immediately and $InCl_3$ and $AlCl_3$ are highly soluble to the etchant employed in the present disclosure. In the case of a conventional ELO (i.e., AlAs+HF), the reaction products are $AlF_3$ and $AsH_3$. $AsH_3$ is a gaseous product and can diffuse from the reaction front immediately. $AlF_3$ can react with the HF or $H_2O$ to dissolve into the water. However, the amount of $AlF_3$ that can dissolve into water is low and some of the $AlF_3$ reaction product can remain on the surface of the base substrate 10.

The non-HF etchant that can be employed in the present disclosure to remove the sacrificial phosphide-containing layer 14 from the structure includes any non-HF containing acid that (i) selectively etches the sacrificial phosphide-containing layer 14 relative to the other semiconductor layers (i.e., layers 10, 12, 16) and the optional protection layers that are present in the structures, and (ii) that dissolves the etched reaction product such that no etched reaction product forms on the surface of the base substrate 10. Examples of non-HF containing acids that can be employed in the present disclosure include, but are not limited to, HCl, HBr, HI and mixtures thereof. The non-HF containing acid(s) may be used neat, or they may be diluted with water to provide a dilute non-HF containing acid or dilute non-HF containing acid mixture. The concentration of the non-HF containing acid that can be employed in the present disclosure to remove the sacrificial phosphide-containing layer 14 from the structures can range from 1% to 99%. Other concentrations can be used so long as the concentration of the non-HF containing acid does not adversely effect (i) the selectively of the non-HF containing acid for etching the sacrificial phosphide-containing layer 14 and (ii) the ability of the non-HF containing acid to dissolve the etched reaction product such that no etched reaction product forms on the surface of the base substrate 10. A higher concentration of non-HF etchant is preferred to keep the surface atomically smooth after the etch due to the passivation effect.

In one embodiment, the etch used to remove the sacrificial phosphide-containing layer 14 from the structures can be performed at room temperature (i.e., from 20° C.-40° C.). In another embodiment, the etch used to remove the sacrificial phosphide-containing layer 14 from the structures can be performed at an elevated temperature that is greater than room temperature up to, but not beyond, the boiling point of the non-HF containing etchant. In one example, the elevated temperature can be from greater than 40° C. up to 100° C.

The etching process can be performed utilizing techniques well known to those skilled in the art including, for example, dipping an edge portion of the structure into a bath containing a non-HF etchant, immersing the entire structure into a bath containing a non-HF etchant, spraying the non-HF etchant onto an edge portion of the structure, or brushing coating the non-HF containing etchant onto an edge portion. Any combination of these techniques can also be used to etch the sacrificial phosphide-containing layer 14 from the structure.

The duration of the etching step may vary depending on the type of non-HF etchant employed, the conditions that the etch was performed and the length of the initial base substrate 10 employed. In one embodiment, the duration of the etch is typically from 1 hour to 7 days, with a duration from 1 hour to 1 day being more typical. The etch may be performed for a longer or shorter duration than the ranges mentioned above depending on the size of the wafer and the technique applied during the etch.

In the embodiment illustrated in FIG. 6A, the semiconductor device layer 16 is 'released' from the base substrate 10. The semiconductor device layer 16 that is released can be used as is, or it can be disposed atop a flexible or other rigid substrate. With respect to the 'released' base substrate 10, the 'released' base substrate 10 can be re-used. In addition, the surface roughness of the 'released' base substrate 10 is essentially the same, within ±0.5 nm, as that of the initial surface roughness of the base substrate 10. Also, the thickness of the 'released' base substrate is essentially the same, within ±100 nm, as that of the initial thickness of the base substrate 10 prior to performing the etch.

In the embodiment illustrated in FIG. 6B, the semiconductor device layer 16 is 'released' from the base substrate 10. The semiconductor device layer 16 that is released can be used as is, or it can be disposed atop another substrate such as, for example, a flexible substrate. With respect to the 'released' base substrate 10, the 'released' base substrate 10 illustrated in FIG. 6B still contains the optional semiconductor buffer layer 12 thereon. In some embodiments, the optional semiconductor buffer layer 12 can remain atop the base substrate and this structure can be re-used.

Figure 7:
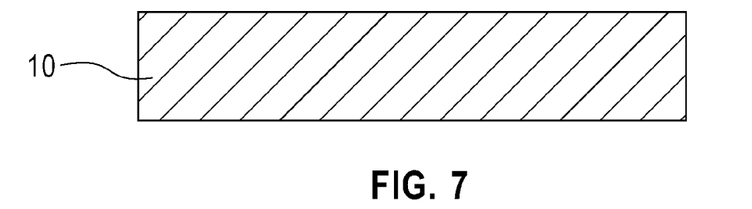
FIG. 7 is a pictorial representation (through a cross sectional view) depicting the structure of FIG. 6B after removing the optional semiconductor buffer layer from the upper surface of the base substrate.

In other embodiments, and as shown in FIG. 7, the optional semiconductor buffer layer 12 can be removed from the upper surface of the base substrate 10. In one embodiment, the optional semiconductor buffer layer 12 can be removed from the upper surface of the base substrate 10 by utilizing chemical mechanical polishing. In another embodiment, the optional semiconductor buffer layer 12 can be removed from the upper surface of the base substrate 10 by a chemical wet etch process, the chemical wet etch process is preferred to lower the cost. The base substrate 10 shown in FIG. 7 can be re-used. In addition, the surface roughness of the 'released' base substrate 10 shown in FIG. 7 is essentially the same, within ±0.5 nm, as that of the initial surface roughness of the base substrate 10. Also, the thickness of the 'released' base substrate is essentially the same, within ±100 nm, as that of the initial thickness of the base substrate 10 prior to performing the etch.

Figure 8:
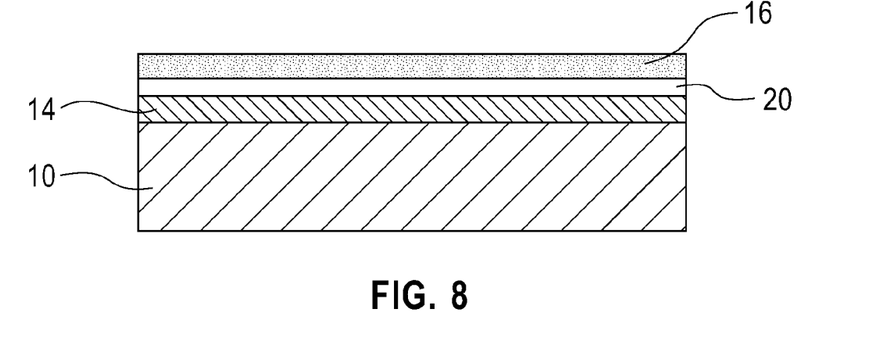
FIG. 8 is a pictorial representation (through a cross sectional view) depicting a structure that includes a first protection layer located between a semiconductor device layer and a sacrificial phosphide-containing layer that can be employed in one embodiment of the present disclosure.
Figure 9:
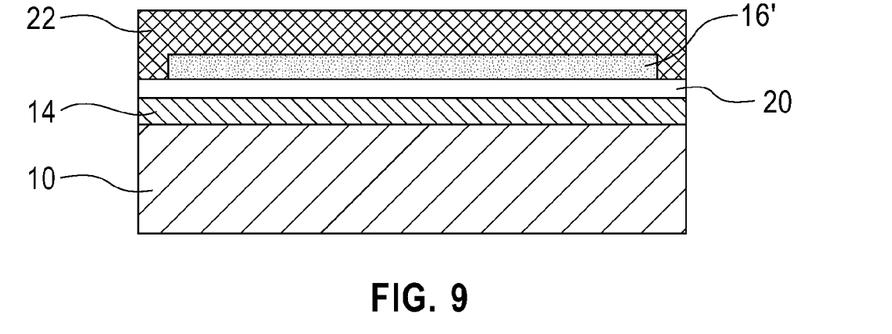
FIG. 9 is a pictorial representation (through a cross sectional view) depicting the structure of FIG. 8 after patterning the semiconductor device layer and forming a second protection layer thereon.
Figure 10:
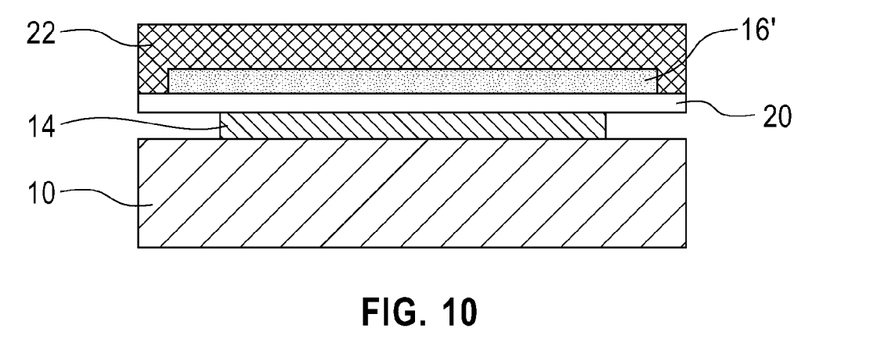
FIG. 10 is a pictorial representation (through a cross sectional view) depicting the structure of FIG. 9 during an initial stage of an etching process in accordance with the present disclosure.

Reference is now made to FIGS. 8-10 which illustrate the embodiment mentioned above in which the semiconductor device layer 16 may also include a phosphide-containing material and thus it has the same etching rate as that of the sacrificial phosphide-containing layer 14. In such an embodiment and as shown in FIG. 8, a first protection layer 20 is formed between the sacrificial phosphide-containing layer 14 and the semiconductor device layer 16 to prevent the semiconductor device layer 16 from being etched by the non-HF etchant. Although not shown, an optional semiconductor buffer layer can also be formed between the base substrate 10 and the sacrificial phosphide-containing layer 14. As mentioned above, the first protection layer 20 can be GaAs or other non-phosphide-containing materials which are not etched by the non-HF etchant. The first protection layer 20 can be formed by conventional techniques as also mentioned above.

After providing the structure shown in FIG. 8, the semiconductor device layer 16 can be patterned by lithography and etching to provide a patterned semiconductor device layer 16'. In some embodiments, the patterning step can be omitted and the second protection layer is formed on an upper surface and sidewall edges of the semiconductor device layer 16 shown in FIG. 8. Next, a second protection layer 22 is formed atop exposed surfaces (top and sidewalls) of the patterned semiconductor device layer 16' to prevent the patterned semiconductor device layer 16' from being etched by the non-HF etchant. As mentioned above, the second protection layer 22 could be $SiO_2$, $Si_3N_4$ or other materials which are not etched by the non-HF etchant. The second protection layer 22 can be formed utilizing conventional techniques that are well known to those skilled in the art including thermal growth or deposition. The resultant structure including the patterned semiconductor device layer 16' and the second protection layer 22 is shown, for example, in FIG. 9.

FIG. 10 shows the structure during an early stage of the etch process in which the etch selectively removes the sacrificial phosphide-containing layer 14. After removing the patterned semiconductor device layer 16' and the underlying first protection layer 20, an etch can be used to remove at least the second protection layer 22 from the structure. The same etch or another etch could be used to remove the underlying first protection layer 20. In some embodiments, the first protection layer 20 can remain beneath the released, patterned semiconductor device layer 16'.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of releasing a semiconductor device layer from a base substrate, said method comprising:
   forming a sacrificial phosphide-containing layer on an upper surface of a base substrate;
   forming a first protection layer on an upper surface of the sacrificial phosphide-containing layer;
   forming a semiconductor device layer on an upper surface of the first protection layer, wherein said semiconductor device layer is a same semiconductor material as the sacrificial phosphide-containing layer;
   forming a second protection layer on an upper surface of the semiconductor device layer; and
   removing the sacrificial phosphide-containing layer from between the semiconductor device layer and the base substrate, wherein said removing comprises etching with a non-HF containing etchant.

2. The method of claim 1, wherein said base substrate is an III-V compound semiconductor material.

3. The method of claim 1, wherein said base substrate is a Ge-containing semiconductor material.

4. The method of claim 3, further comprising forming a semiconductor buffer layer between the Ge-containing semiconductor substrate and the sacrificial phosphide-containing layer.

5. The method of claim 3, wherein said semiconductor buffer layer is an III-V compound semiconductor material.

6. The method of claim 1, wherein said non-HF etchant is a non-HF containing acid.

7. The method of claim 6, wherein said non-HF containing acid is selected from the group consisting of HCl, HBr, HI and mixtures thereof.

8. The method of claim 1, wherein said removing the sacrificial phosphide-containing layer utilizing said non-HF containing etchant is performed at a temperature from room temperature up to, but not beyond a boiling point of the non-HF containing etchant.

9. The method of claim 1, wherein after removing the sacrificial phosphide-containing layer from between the base substrate and the semiconductor device layer, said base substrate has a RMS surface roughness of from 0.1 nm to 0.5 nm or within ±0.5 nm of an initial RMS roughness.

10. The method of claim 1, wherein said sacrificial phosphide-containing layer is composed of a compound of phosphorus and at least one element that is less electronegative than said phosphorus.

11. The method of claim 10, wherein said sacrificial phosphide-containing layer comprises InAlP, InGaP, InAsP, GaAsP, InGaAlP, InGaAsP, GaP, InP and phosphide-containing alloys.

12. The method of claim 1, wherein said sacrificial phosphide-containing layer is a different semiconductor material than said base substrate.

13. A method of releasing a semiconductor device layer from a base substrate, said method comprising:
    forming a semiconductor buffer layer on an upper surface of a base substrate;
    forming a sacrificial phosphide-containing layer on an upper surface of the semiconductor buffer layer;
    forming a first protection layer on an upper surface of the sacrificial phosphide-containing layer;
    forming a semiconductor device layer on an upper surface of the first protection layer, wherein said semiconductor device layer is a same semiconductor material as the sacrificial phosphide-containing layer;
    forming a second protection layer on an upper surface of the semiconductor device layer; and
    removing the sacrificial phosphide-containing layer located between the semiconductor device layer and the base substrate, wherein said removing comprising etching with a non-HF containing etchant.

14. The method of claim 13, further comprising removing the semiconductor buffer layer from atop the base substrate.

15. The method of claim 13, wherein said base substrate is an III-V compound semiconductor material.

16. The method of claim 13, wherein said base substrate is a Ge-containing semiconductor substrate.

17. The method of claim 16, wherein said Ge-containing semiconductor material comprises SiGe alloy.

18. The method of claim 13, wherein said non-HF etchant is a non-HF containing acid.

19. The method of claim 18, wherein said non-HF containing acid is selected from the group consisting of HCl, HBr and HI and mixtures thereof.

20. The method of claim 13, wherein said removing the sacrificial phosphide containing layer utilizing said non-HF containing etchant is performed at a temperature from room temperature up to, but not beyond a boiling point of the non-HF containing etchant.

21. The method of claim 13, wherein after removing the sacrificial phosphide-containing layer and the semiconductor buffer layer from between the base substrate and the semiconductor device layer, said base substrate has a RMS surface roughness of from 0.1 nm to 0.5 nm or within ±0.5 nm of an initial RMS roughness.

22. The method of claim 13, wherein said sacrificial phosphide-containing layer is composed of a compound of phosphorus and at least one element that is less electronegative than said phosphorus.

23. The method of claim 22, wherein said sacrificial phosphide-containing layer comprises InAlP, InGaP, InAsP, GaAsP, InGaAlP, InGaAsP, GaP, InP and phosphide-containing alloys.

24. The method of claim 13, wherein said sacrificial phosphide-containing layer is a different semiconductor material than said base substrate.

* * * * *